US006294936B1

United States Patent
Clementi

(10) Patent No.: US 6,294,936 B1
(45) Date of Patent: Sep. 25, 2001

(54) SPREAD-SPECTRUM MODULATION METHODS AND CIRCUIT FOR CLOCK GENERATOR PHASE-LOCKED LOOP

(75) Inventor: Daniel M. Clementi, Doylestown, PA (US)

(73) Assignee: American Microsystems, Inc., Pocatello, ID (US)

(*) Notice: Subject to any disclaimer, the term of this patent is extended or adjusted under 35 U.S.C. 154(b) by 0 days.

(21) Appl. No.: 09/161,969

(22) Filed: Sep. 28, 1998

(51) Int. Cl.[7] .................................................. H03D 1/04
(52) U.S. Cl. ............................................ 327/156; 327/147
(58) Field of Search ................................ 327/141, 147, 327/156, 113, 114; 331/78; 375/200

(56) References Cited

U.S. PATENT DOCUMENTS

| | | | |
|---|---|---|---|
| 5,249,199 | 9/1993 | Mayer et al. | 375/1 |
| 5,263,055 | 11/1993 | Cahill | 375/99 |
| 5,334,952 | * 8/1994 | Maddy et al. | 331/1 A |
| 5,488,627 | 1/1996 | Hardin et al. | 375/204 |
| 5,491,458 | 2/1996 | McCune, Jr. et al. | 331/74 |
| 5,610,955 | 3/1997 | Bland | 375/376 |
| 5,631,920 | 5/1997 | Hardin | 375/200 |
| 5,651,035 | 7/1997 | Tozun et al. | 375/373 |
| 5,659,587 | 8/1997 | Knierim | 375/376 |
| 5,731,727 | 3/1998 | Greiss | 327/299 |
| 5,736,893 | 4/1998 | Puckette et al. | 327/551 |
| 5,986,512 | * 11/1999 | Eriksson | 331/16 |

OTHER PUBLICATIONS

"Digital PLL Frequency Synthesizers" by Ulrich L. Rohde, Ph.D., Sc. D., pp. 210–213, Prentice Hall, Inc. (1983).

Xilinx Application Note, Efficient Shift Registers, LFSR Counters, and Long Pseudo–Random Sequence Generators XAPP 052, Jul. 7, 1996.

"Electronic Communications" by Roddy et al.; Chapter 6: Oscillators pp. 209–210; Sections 6.9, 6.9.1 and 6.9.2; Reston Publishing (1981).

"Frequency Modulation of System Clocks for EMI Reduction" by Cornelis D. Hockstra; Aug. 1997 Hewlett–Packard Journal pp. 1–7.

Linear Feedback Shift Registers; (http://www.cdg.ord/a_ross/LFSR) (Jun. 24, 1998).

"The Art of Electronics" by P. Horowitz et al., pp. 644–646, 2nd Ed., Cambridge University Press (1994).

* cited by examiner

*Primary Examiner*—Tuan T. Lam
(74) *Attorney, Agent, or Firm*—Renner, Otto, Boisselle & Sklar, LLP

(57) ABSTRACT

A spread-spectrum modulation method and circuit for a clock generator phase-locked loop (PLL). A dither signal is injected into a PLL in synchronization with and having the same period or fraction of the same period as the phase comparison performed within the PLL. Over such period, the phase error caused by the modulation will integrate to zero and hence avoid transmitting a disturbance to the loop. A particular embodiment utilizes an output of the reference divider and/or feedback divider within the PLL to generate the dither signal. Such a configuration avoids the need for additional hardware which otherwise would increase the chip area and/or cost of the device. The reference divider and/or feedback divider is made up preferably of a linear feedback shift register (LFSR). One or more stages of the LFSR provide an output which is used to generate the dither signal. In a preferred embodiment, the output from the LFSR exhibits a pseudo-random sequence.

29 Claims, 7 Drawing Sheets

| ADDRESS | DATA |
|---|---|
| 0 | modval 0 |
| 1 | modval 1 |
| 2 | modval 2 |
| M - 2 | modval ( M - 2 ) |
| M - 1 | modval ( M - 1 ) |

SPREAD-SPECTRUM MODULATION METHODS AND CIRCUIT FOR CLOCK GENERATOR PHASE-LOCKED LOOP

TECHNICAL FIELD

The present invention relates to a method and circuit for modulating a clock signal to spread its spectral energy over a band of frequencies.

BACKGROUND OF THE INVENTION

Electronic devices and systems such as microprocessors rely on clock signals to provide timing control. Such clock signals typically are based on a precision reference source such as a crystal oscillator. However, a crystal oscillator has a high Q value which results in the spectral energy of the clock signal being concentrated in a very narrow frequency band. The concentration of the energy at the clock frequency as well as its harmonics can lead to emission of electromagnetic interference (EMI) in excess of that permitted under applicable government regulations.

In certain electronic systems it is possible to dither or modulate the frequency of the clock signal in order to spread its spectral energy over a band of frequencies. The result of this spreading is a reduction of the energy of the clock or harmonics of the clock that might otherwise appear at any particular frequency or band. Such dithering of the clock signal facilitates compliance with the applicable government regulations.

Various approaches have been proposed for dithering a clock signal. For example, Hewlett-Packard has developed a technique for dithering the reference divider of a phase-locked loop (PLL) between values to create a modulation profile. U.S. Pat. No. 5,610,955 is directed to a variation of such technique that dithers both the reference divider and the feedback divider in a PLL in order to spread the resultant clock signal.

Although these approaches are successful in dithering the clock signal, there are however a number of disadvantages. For example, by dithering the feedback divider and/or reference divider the PLL is continually being driven out of lock. This means that the PLL loop dynamics (e.g., unity-gain frequency, damping, etc.) affect the performance of the resulting modulation. If the loop bandwidth is too narrow, the modulating profile is filtered. If the loop bandwidth is set up to be very wide, compromises must be made regarding the precision of the resulting output frequency and step size. As is known, wide loop bandwidths require small integers in the feedback divider path.

Another disadvantage of such conventional approaches is the requirement for significant additional hardware in order to implement clock dithering. For example, additional dividers are oftentimes necessary. Such additional hardware occupies chip area and increases the size and/or cost of the electronic device.

In view of the aforementioned shortcomings associated with conventional approaches, there is a strong need in the art for an improved method and circuit for dithering a clock signal. In particular, there is a strong need for a method and circuit for dithering a clock signal generated by a PLL which avoids continually driving the PLL out of lock. Moreover, there is a strong need in the art for a circuit and method for dithering a clock signal generated by a PLL which does not require significant additional hardware.

SUMMARY OF THE INVENTION

A spread-spectrum modulation method and circuit for a clock generator phase-locked loop is described herein in accordance with the present invention. In a preferred embodiment, the present invention involves injecting a dither signal into a PLL that is synchronized with and has the same period or fraction of the same period as the phase comparison performed within the PLL. Over such period, the phase error caused by the modulation will integrate to zero and hence avoid transmitting a disturbance to the loop. Consequently, the present invention avoids continually driving the PLL out of lock.

A particular embodiment of the present invention utilizes an output of the reference divider and/or feedback divider within the PLL to generate the dither signal. The dither signal will consequently have the same period or fraction of the same period as the comparison performed by the PLL phase comparator. The PLL phase comparator is a sampled-data system which has a zero in its transfer function for phase modulation at its input where the frequency of such phase modulation is equal to the sampling frequency or multiples thereof.

Moreover, such a configuration avoids the need for additional hardware which otherwise would increase the chip area and/or cost of the device. In a preferred embodiment, the reference divider and/or feedback divider is made up of a linear feedback shift register (LFSR). One or more stages of the LFSR provide an output which is used to generate the dither signal. In a preferred embodiment, the output from the LFSR exhibits a pseudo-random sequence. This tends to spread the frequency of the clock signal more randomly so as to avoid introducing undesirable harmonics.

According to a particular aspect of the present invention, a clock generator phase-locked loop is provided. The phase-locked loop includes a reference frequency source for providing a reference frequency; a phase comparator for producing a control signal based on a periodic comparison of a phase difference between respective signals provided to a first input and a second input of the phase comparator, the reference frequency being operatively coupled to the first input; a voltage-controlled oscillator for generating an output frequency based on the control signal provided by the phase comparator; a feedback divider which receives and divides the output frequency to provide a divider output which is operatively coupled to the second input of the phase comparator; and a modulation circuit for injecting a dither signal within the clock generator phase-locked loop to modulate the output frequency, a period of the dither signal being equal to or an integer fraction of a phase comparison period of the phase comparator.

According to another aspect of the invention, a clock generator phase-locked loop is provided which includes a reference frequency source for providing a reference frequency; a phase comparator for producing a control signal based on a phase difference between respective signals provided to a first input and a second input of the phase comparator, the reference frequency being operatively coupled to the first input; a voltage-controlled oscillator for generating an output frequency based on the control signal provided by the phase comparator; a feedback divider which receives and divides the output frequency to provide a divider output which is operatively coupled to the second input of the phase comparator; and a modulation circuit for injecting a dither signal within the clock generator phase-locked loop to modulate the output frequency, wherein at least one of a reference divider included in the reference frequency source and the feedback divider comprises a linear feedback shift register counter having a plurality of stages, and the modulation circuit comprises an output of at least one of the plurality of stages which is used to produce the dither signal.

In accordance with yet another aspect of the invention, a method is provided for dithering a clock generator phase-locked loop including a reference frequency source for providing a reference frequency, a phase comparator for producing a control signal based on a periodic comparison of a phase difference between respective signals provided to a first input and a second input of the phase comparator, the reference frequency being operatively coupled to the first input, a voltage-controlled oscillator for generating an output frequency based on the control signal provided by the phase comparator, and a feedback divider which receives and divides the output frequency to provide a divider output which is operatively coupled to the second input of the phase comparator. The method includes the step of injecting a dither signal within the clock generator phase-locked loop to modulate the output frequency, a period of the dither signal being equal to or an integer fraction of a phase comparison period of the phase comparator.

According to still another aspect of the invention, a method is provided for dithering a clock generator phase-locked loop including a reference frequency source for proving a reference frequency, a phase comparator for producing a control signal based on a phase difference between respective signals provided to a first input and a second input of the phase comparator, the reference frequency being operatively coupled to the first input, a voltage-controlled oscillator for generating an output frequency based on the control signal provided by the phase comparator, and a feedback divider which receives and divides the output frequency to provide a divider output which is operatively coupled to the second input of the phase comparator, wherein at least one of a reference divider included in the reference frequency source and the feedback divider comprises a linear feedback shift register counter having a plurality of stages. The method includes the step of injecting a dither signal within the clock generator phase-locked loop to modulate the output frequency, the dither signal being based on an output of at least one of the plurality of stages.

To the accomplishment of the foregoing and related ends, the invention, then, comprises the features hereinafter fully described and particularly pointed out in the claims. The following description and the annexed drawings set forth in detail certain illustrative embodiments of the invention. These embodiments are indicative, however, of but a few of the various ways in which the principles of the invention may be employed. Other objects, advantages and novel features of the invention will become apparent from the following detailed description of the invention when considered in conjunction with the drawings.

BRIEF DESCRIPTION OF THE DRAWINGS

FIG. 3 is a look-up table for use in accordance with the example of FIG. 2;

DESCRIPTION OF THE PREFERRED EMBODIMENTS

Figure 1:
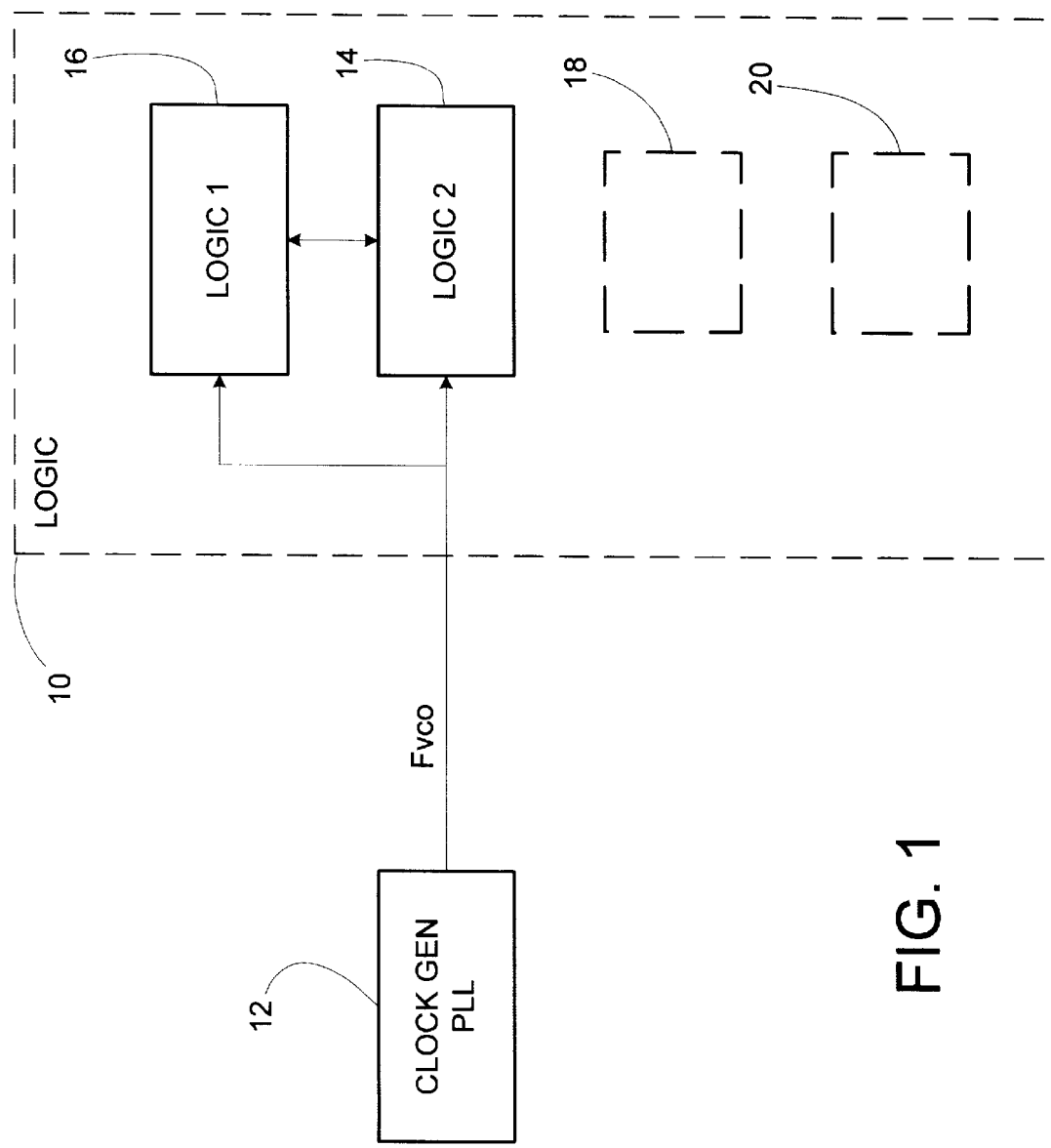
FIG. 1 is a block diagram of an exemplary digital logic system utilizing a spread-spectrum clock generator phase-locked loop in accordance with the present invention.

The present invention will now be described with reference to the drawings, wherein like reference numerals are used to refer to like elements throughout.

FIG. 1 illustrates a logic system 10 which utilizes a clock signal Fvco for providing timing control. In accordance with the present invention, a clock generator phase-locked loop (PLL) 12 produces the clock signal Fvco provided to the system 10. The system 10 includes, for example, digital logic blocks 14 and 16 forming part of a larger logic circuit or the like. The clock signal Fvco is input directly to the logic blocks 14 and 16. The logic blocks 14 and 16 are designed to use the clock signal Fvco for timing control and/or derive other clock signals therefrom as part of their operation. The system 10 may include various other logic blocks (e.g., 18 and 20) which may or may not rely directly on the clock signal Fvco for timing control.

The clock generator PLL 12 of the present invention produces a clock signal which has its spectral energy spread over a band of frequencies, thereby avoiding excessive EMI. In addition, any other clock signals derived from the clock signal are spread so as to avoid further excessive EMI.

Moreover, the clock generator PLL 12 is not continually driven out of lock by dithering as has been the case in conventional clock generator PLLs. As is described more fully below in relation to the examples of FIGS. 2 thru 6, a dither signal is introduced within the clock generator PLL 12 which is synchronized with the phase comparison performed therein. More particularly, the period of the dither signal is equal to or an integer fraction of the period at which phase comparisons are performed by the phase comparator. The phase error which is introduced by the dither signal will integrate to zero as a result, and little or no disturbance is transmitted to the loop. By using the output of a divider/counter included in the clock generator PLL 12 to produce the dither signal, a modulated clock signal can be obtained at relatively low cost as compared to conventional techniques.

Figure 2:
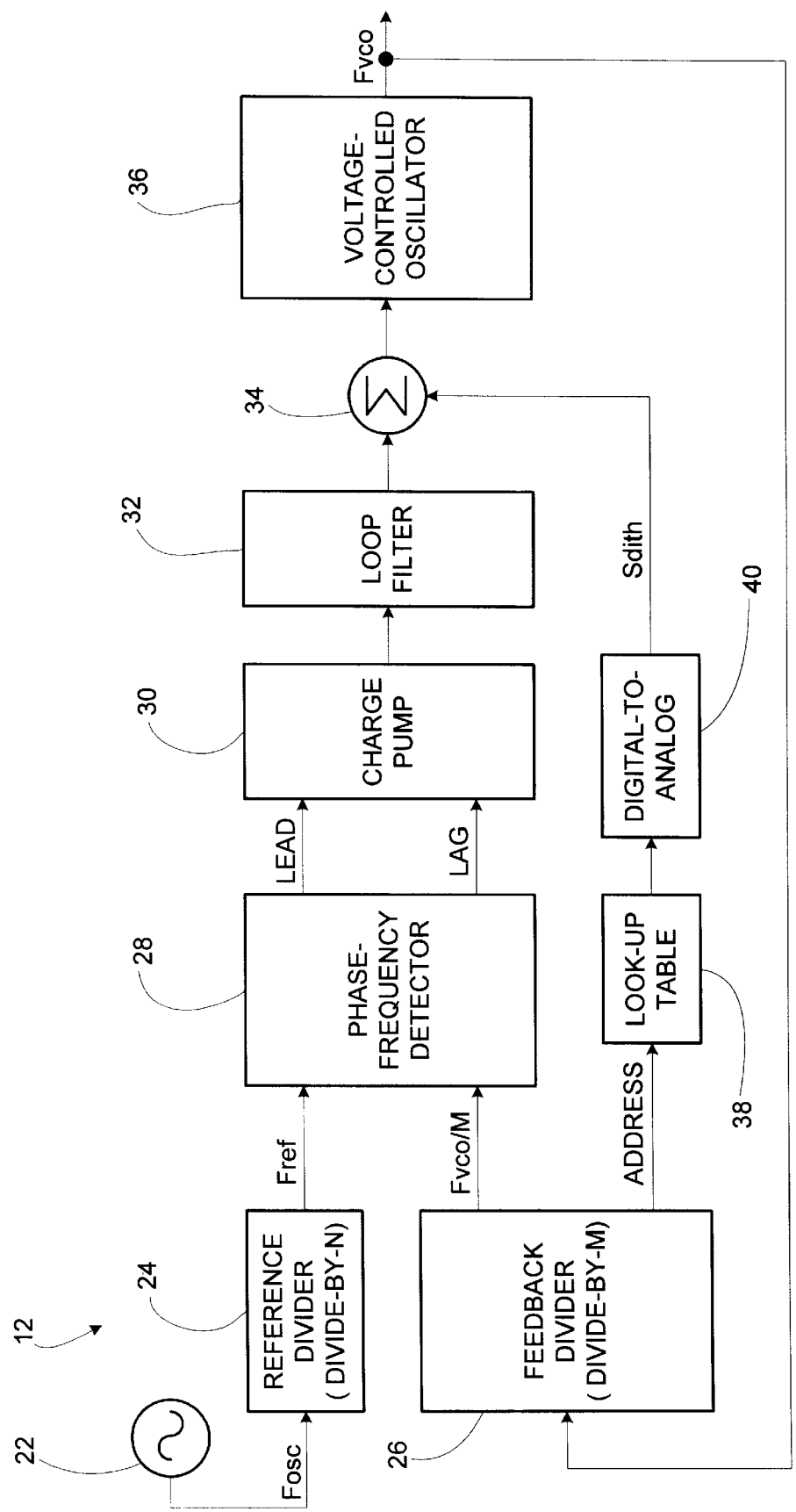
FIG. 2 is a block diagram of a first example of a clock generator phase-locked loop in accordance with the present invention.

FIG. 2 shows a first example of the clock generator PLL 12 in accordance with the present invention. The clock generator PLL 12 receives as an input a reference oscillator frequency Fosc from a reference oscillator 22. The reference oscillator 22 preferably is a precision oscillator such as a crystal oscillator which provides a stable oscillator frequency Fosc. The oscillator frequency Fosc preferably is a square-wave as is conventional.

The clock generator PLL 12 includes a reference divider 24 and a feedback divider 26. The reference divider 24 is a divide-by-N divider (where N is an integer) which divides the oscillator frequency Fosc received at an input, and produces a divided reference frequency Fref at its output. The reference divider 24 may be any conventional divider such as a binary counter.

The reference frequency Fref output by the reference divider 24 is input to a first input of a phase detector/comparator 28 also included in the clock generator PLL 12. The phase comparator 28 can be a standard PLL phase comparator such as a type I or type II phase comparator see, e.g., P. Horowitz et al., *The Art of Electronics*, pp. 644–646, 2nd Ed., Cambridge University Press (1994)); or a sample/hold type phase comparator (see, e.g., U. Rohde, *Digital PLL Frequency Synthesizers*, pp. 210–213, Prentice-Hall, Inc. (1983)). The phase comparator 28 periodically compares the phase of the reference frequency Fref with that of a feedback signal (discussed below) and produces an output based on the phase difference therebetween. More specifically, the phase comparator 28 compares the phase of the respective input signals responsive to edges of the reference frequency Fref from the reference divider 24 and the output of the feedback divider 26 (Fvco/M). Based on such comparison, the phase comparator 28 produces an output signal representative of the amount by which the phase of the reference frequency Fref leads or lags the feedback signal.

The output from the phase comparator 28 is input to a charge pump 30 (which in some instances is part of the phase comparator 28 itself). The charge pump 30 increases or decreases a control voltage provided at its output based on whether the reference frequency Fref leads or lags the feedback signal. The control voltage from the charge pump 30 is then filtered via a loop filter 32 as is conventional. Specifically, the loop filter 32 is a low pass filter for filtering fluctuations in the output of the charge pump 30.

In a conventional PLL, the output of the loop filter 32 typically serves as the control voltage provided to a voltage-controlled oscillator (VCO). According to the exemplary embodiment, however, the output of the loop filter 32 is input to an summer 34. As is discussed in more detail below, the summer 34 is used to modulate the control voltage provided to the VCO. Specifically, the output of the summer 34 provides a voltage control signal which is input to a VCO 36 included within the clock generator PLL 12. The output frequency Fvco of the VCO 36 is based on the control signal input to the VCO 36 as is conventional. The output frequency Fvco serves a s the output of the clock generator PLL 12 and is input to the electronic system 10 (FIG. 1), for example.

The output frequency Fvco of the VCO 36 is fed back to the input of the feedback divider 26. The feedback divider 26 is a divide-by-M divider where M is an integer. The value of M may be fixed or programmable according to known techniques. The feedback divider 26 divide s the output frequency Fvco by M and produces a feedback signal Fvco/M which is provided to the feedback input of the phase comparator 28. As pointed out above, the phase comparator 28 compares the phase of the reference frequency Fref and the feedback signal Fvco/TM s o as to lock in on the desired output frequency Fvco.

The combination of the reference divider 24, phase comparator 28, charge pump 30, loop filter 32, VCO 36 and feedback divider 26 form what is otherwise known as a conventional PLL. The clock generator PLL 12 differs from such conventional PLLs, however, by the manner in which the output frequency Fvco is dithered or modulated so as to spread the spectral energy over a band of frequencies. Specifically, a dither signal Sdith is injected into the PLL via the adder 34 in order to modulate the output frequency Fvco. The modulating waveform represented by Sdith is synchronized with the phase comparison performed by the phase comparator 28, and has the same period or fraction of the same period as the phase comparison performed by the phase comparator 28.

A preferred way for generating a dither signal Sdith which is synchronized with and has the same period or fraction of the same period as the phase comparator 28 is to use the feedback divider 26, the reference divider 24, or both to generate the signal. For example, in the embodiment of FIG. 2 the feedback divider 26 is a standard binary counter used as a divider. A first output of the counter changes state once every M cycles of the output frequency Fvco, and is coupled to the input of the phase comparator 28. Those having ordinary skill in the art will appreciate the manner in which a standard binary counter may be designed to provide such an output.

Additionally, however, the counter forming the feedback divider 26 provides a second output representing the particular value, or state, of the counter. As will be appreciated, the value of the second counter output will be continuously incremented from 0 to M−1 with each cycle of the output frequency Fvco. This second output provides a sequence of addresses from 0 to M−1 to a look-up table 38 included in the clock generator PLL 12. As is shown in FIG. 3, the look-up table 38 has stored therein a sequence of modulation values modval0 thru modval(M−1) corresponding respectively to the addresses 0 thru M−1.

The modulation values modval0 thru modval(M−1) are discrete values representing the dither signal waveform Sdith. These discrete values are accessed in synchronization with the output frequency Fvco, and hence in synchronization with the reference frequency Fref and the comparisons performed by the phase comparator 28. The modulation values accessed from the look-up table 38 are output to a digital-to-analog convertor 40 which converts the discrete values into an analog signal Sdith which is provided to the other input of the summer 34. Thus, the signal Sdith is added to the output of the loop filter 32 and serves to dither the output of the loop filter 32. This results in the control voltage applied to the VCO 36 being modulated and hence the output frequency Fvco is dithered.

The particular waveform which is stored in the look-up table 38 can be any desired modulation waveform. Such waveform may be preselected based on the desired profile of the resultant spread output frequency Fvco as will be appreciated. The waveform stored in the look-up table 38 may represent a single cycle, or a plurality of cycles depending on the modulating waveform. Such waveform may be periodic such as a sinewave, a triangle wave, a sawtooth wave, etc. Alternatively, such modulating waveform may represent a pseudo-random variable signal which tends to randomly vary the output frequency Fvco. Symmetry of the modulating waveform, either in time or voltage, may be exploited by storing only a portion of the waveform in the table 38 and repeating its application to the VCO 36 in an appropriate fashion.

The look-up table 38 may be constructed from a read-only memory (ROM) or other type memory. The waveform stored therein may be fixed or programmable as will be appreciated.

FIG. 2 illustrates an embodiment in which the count value of the feedback divider 26 provides the addressing for the look-up table 38. However, it will be appreciated that the count value of a counter serving as the reference divider 24 instead could be utilized for addressing the look-up table 38 without departing from the scope of the invention. Even further, the combined output values from the dividers 24 and 26 could be utilized. For example, the output value of one of the dividers may serve as the most significant address bits and the output value of the other divider may serve as the least significant address bits. In each case, the values of the dither signal Sdith are injected into the loop in synchronization with the comparisons performed by the phase comparator 28.

Figure 4:
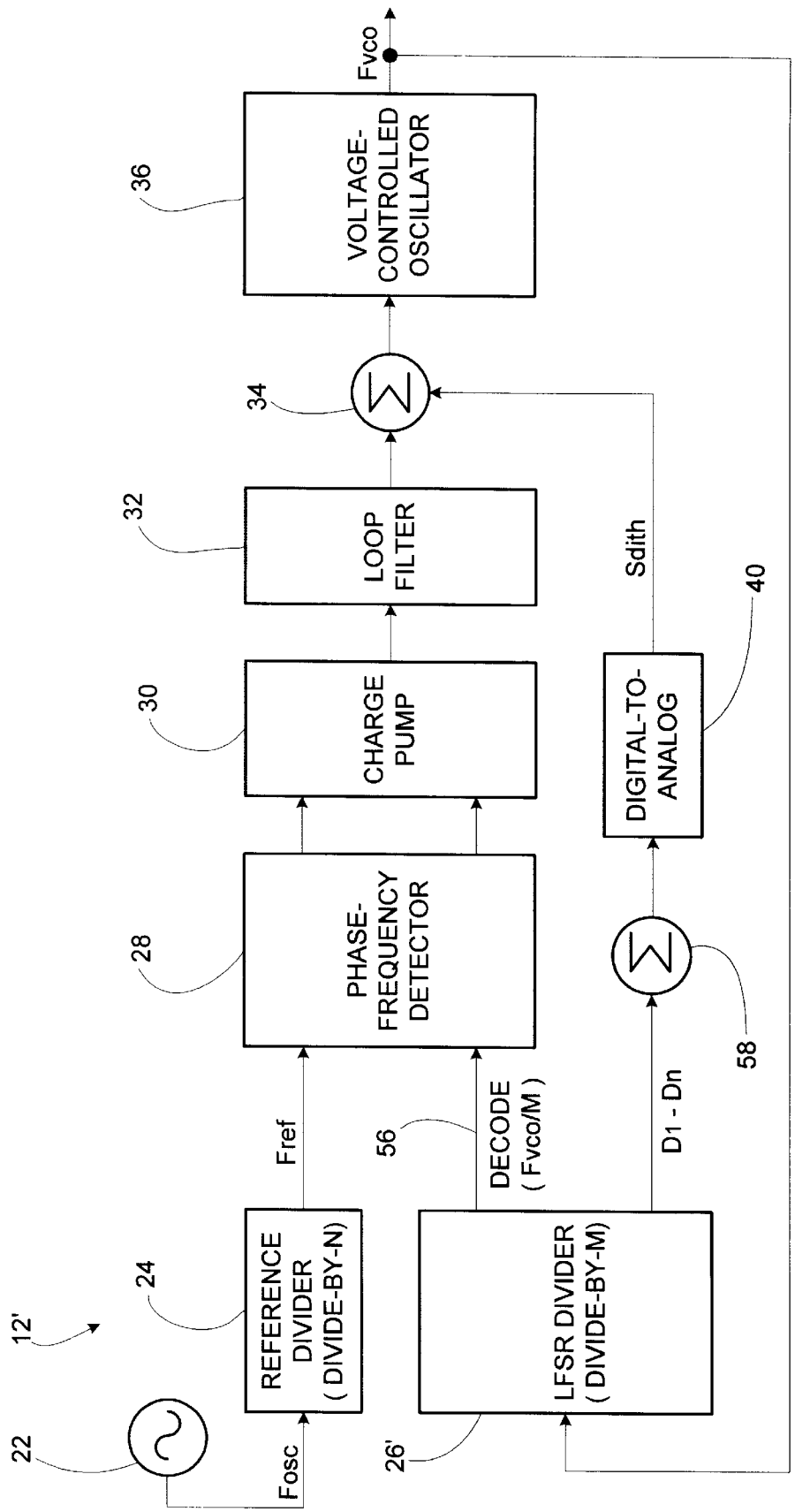
FIG. 4 is a block diagram of a second example of a clock generator phase-locked loop in accordance with the present invention.

Turning now to FIG. 4, another example of a clock generator PLL is designated 12'. The clock generator PLL 12' is identical to that described above with respect to FIG. 2 with the following exceptions. The feedback divider in the present example is designated 26' and is made up of a linear-feedback shift register (LFSR). In addition to functioning as a divide-by-M counter, the LFSR produces an output sequence representing a pseudo-random sequence whose properties can be shown to resemble white noise. By direct application of this output sequence to the control signal of the VCO 36, an effective clock dithering technique can be achieved with very little additional hardware.

Figure 5:
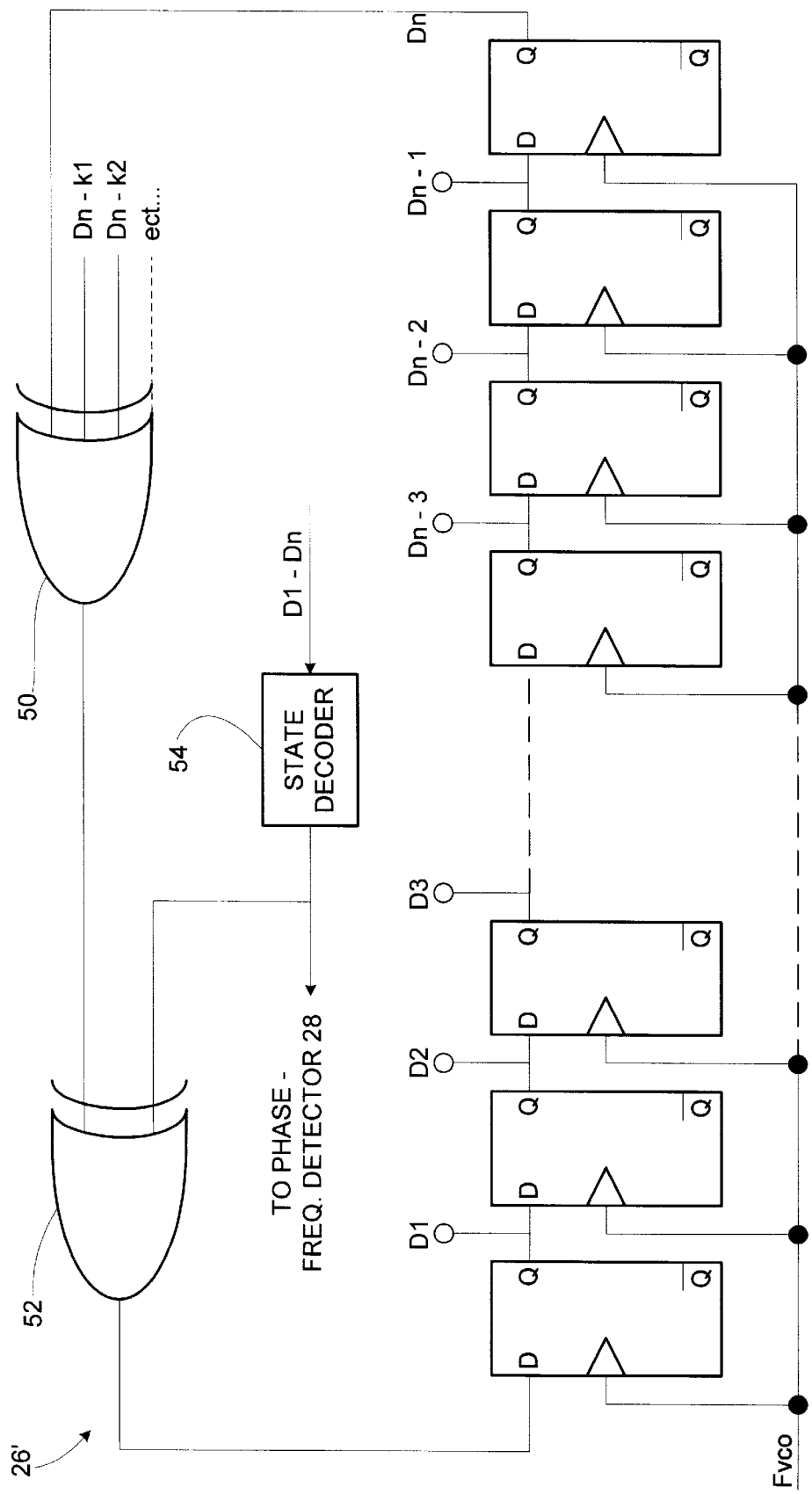
FIG. 5 is a schematic diagram of a linear feedback shift register for serving as a reference divider or feedback divider and serving to provide a dither signal in accordance with the present invention.

As is shown in FIG. 5, the feedback divider 26' is represented by an n-stage shift register made up of n D-type flip-flops cascaded together. The Q output of each flip-flop (designated $D_1$ thru $D_n$, respectively), with the exception of the last in the sequence, is input to the D input of the next flip-flop. The last, or n-th, flip-flop has its output $D_n$ fed back through exclusive-OR gates 50 and 52 to the D input of the first flip-flop in the sequence. The output frequency Fvco is input to the feedback divider 26' and serves as the clock signal to each of the flip-flops.

The exclusive-OR gate 50 receives as its other inputs the outputs of one or more of the other flip-flops (i.e., $D_1$–$D_n$). The particular outputs which are input to the exclusive-OR gate 50 are preselected based on the desired output sequence, and are designated $D_{n-k}$, $D_{n-k2}$, etc. The output of the exclusive OR gate 50 is input to the exclusive-OR gate 52 which exclusive ORs the output with the output of a state decoder 54 included in the feedback divider 26'. The state decoder 54 receives as inputs each of the outputs $D_1$ thru $D_n$ from the respective stages. The state decoder 54 represents logic preconfigured to transition through a predefined number of states (e.g., M) to produce an output on line 56 which includes a pulse every M cycles of the output frequency Fvco. In this manner, the LFSR functions as a divide-by-M divider, and the output of the decoder 54 on line 56 is coupled to the feedback input of the phase comparator 28 (FIG. 2).

Based on which particular outputs $D_1$ thru $D_n$ are fed back through the exclusive-OR gate 50, a pseudo-random sequence is output by the LFSR via the outputs $D_1$ thru $D_n$. As is known, the counting sequence of an LFSR is non-binary and essentially pseudo-random. This pseudo-random sequence is updated with each Fvco cycle, and is updated in synchronization with the phase comparison performed by the phase comparator 28.

Referring back to FIG. 4, the outputs $D_1$, thru $D_n$ from the respective stages of the LFSR are provided to a digital summer 58. It can be observed from FIG. 5 that the output of each stage of the LFSR is simply a time shifted copy of the feedback bit $D_n$. A very simple "boxcar" or moving-average filter can be implemented simply by summing the output of all the shift register outputs together via the summer 58 (e.g., computing the sum of logic "1"s). Such a filter has a sin x/x (low-pass response) and is effective at reducing the high-frequency components present in the pseudo-random data stream presented at the outputs $D_1$ thru $D_n$. The filtered sequence is output by the summer 58 and is input to the digital-to-analog convertor 40. The convertor 40 in turn produces an analog signal which represents the dither signal Sdith used to modulate the output of the loop filter 32 via the summer 34.

Accordingly, the output frequency Fvco is modulated by a dither signal which represents a pseudo-random sequence produced by the LFSR serving as the feedback divider.

Those having ordinary skill in the art of linear feedback shift registers will appreciate the manner in which an LFSR may be configured to operate as a divide-by-M counter for selected value(s) of M as well as to produce a pseudo-random sequence of preselected length. (See, e.g., Xilinx Application Note, *Efficient Shift Registers, LFSR Counters, and Long Pseudo-Random Sequence Generators*, XAPP 052, Jul. 7, 1996). Hence, further detail is omitted herein for sake of brevity.

Although the feedback divider 26' is shown as incorporating the LFSR, it will be appreciated that the reference divider 24 instead/also may utilize an LFSR as shown in FIG. 5 both to function as a divider and to generate the dither signal. The present invention contemplates each situation.

Figure 6:
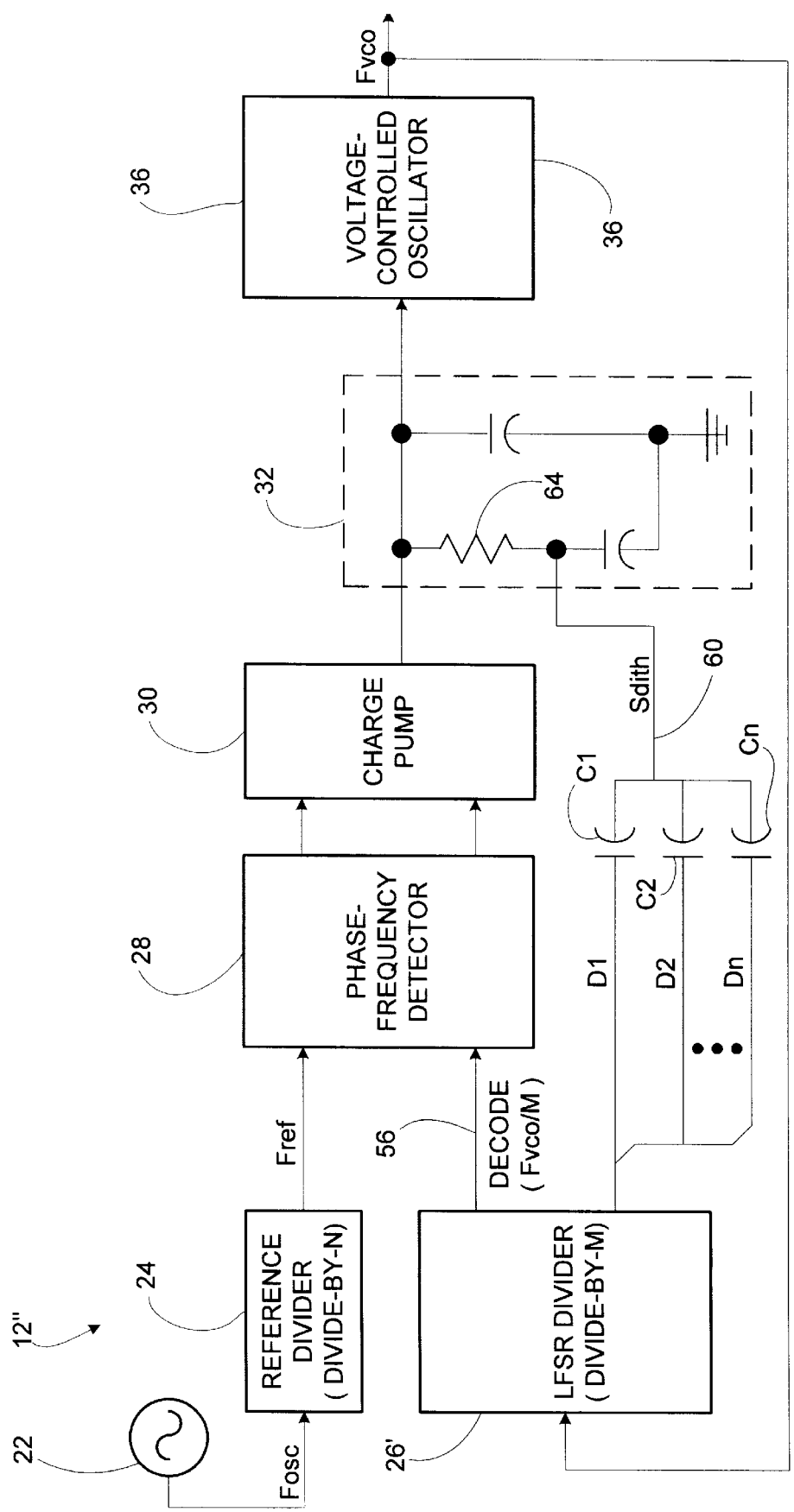
FIG. 6 is a block diagram of a third example of a clock generator phase-locked loop in accordance with the present invention.

FIG. 6 represents a third example of the present invention. The third example is the same as the second example of FIGS. 4 and 5 with the following exceptions. In this example, the outputs $D_1$ thru $D_n$ are each capacitively coupled via a corresponding capacitance $C_1$ thru $C_n$ to a common line 60. The summation of the outputs Dthru $D_n$ thus produced on line 60 represents a moving-average, filtered dither signal Sdith which is coupled directly into the loop filter 32.

The loop filter 32 can be represented by a capacitor 62 and resistor 64 coupled in series. This series combination is arranged in parallel with a capacitor 66, and the parallel combination is connected between the output of the charge pump 30 and ground as shown to form a low pass filter. The dither signal Sdith on line 60 is coupled to the node between the capacitor 62 and the resistor 64 and functions to modulate the control signal which is input to the VCO 36. Accordingly, as the value of Sdith changes in accordance with the sequence presented by the outputs Dthru $D_n$, the output frequency Fvco is modulated so as to spread its spectral energy.

As with the second example, the particular pseudo-random sequence which is output by the LFSR is preselected to provide a desired amount of dithering in the output frequency. In the third example shown in FIG. 6, the direct capacitive coupling of the LFSR outputs to the loop filter 32 is particularly beneficial in that it permits implementation at extremely small hardware cost. Similar to the previous example, the LFSR may instead be part of the reference divider 24 and may be used to generate the dither signal Sdith in the same manner. As in all of the examples, the modulating waveform Sdith is provided in synchronization with the phase comparison performed by the phase comparator 28. Consequently, the error signal integrates to zero and is ignored by the loop resulting in the PLL not being driven out of lock as in the conventional techniques.

Figure 7:
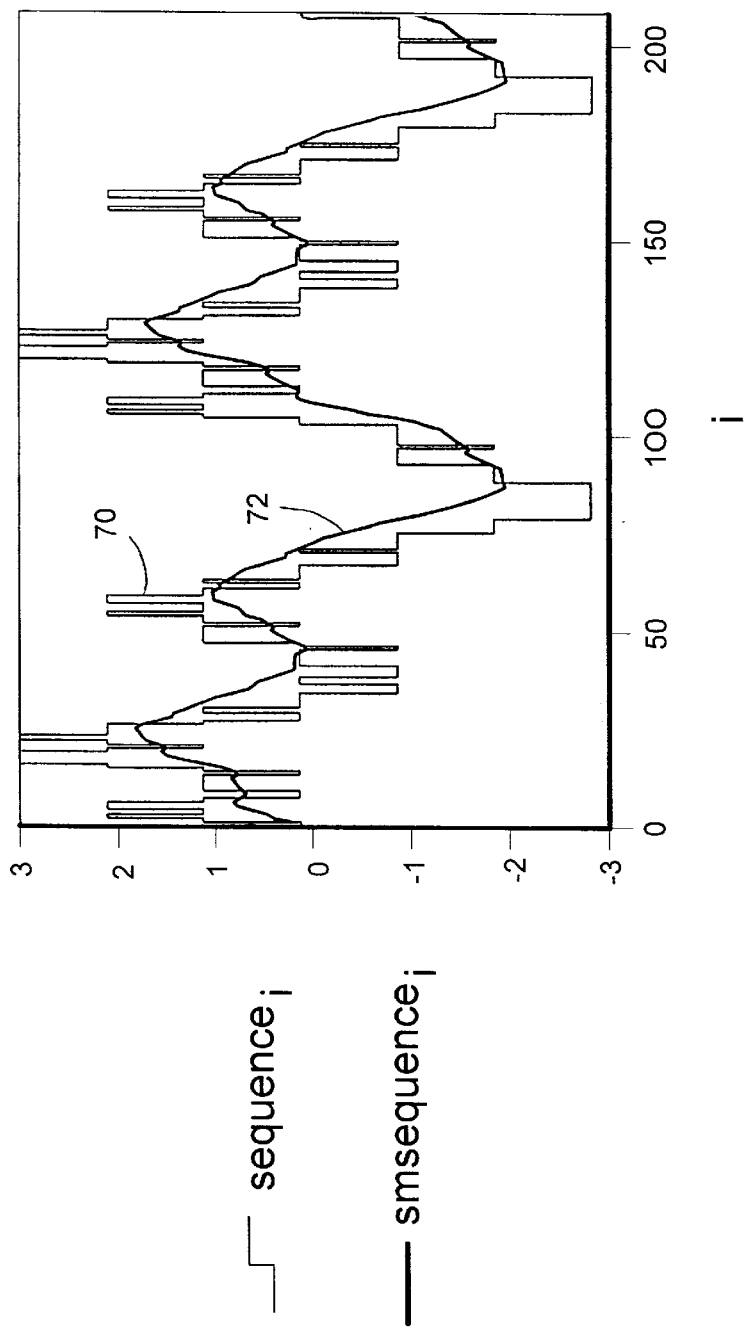
FIG. 7 is a graphical representation of a normalized register sequence and effective voltage profile of an exemplary dither signal in accordance with the present invention.

FIG. 7 illustrates an exemplary normalized register sequence 70 forming Sdith as presented by the capacitively coupled outputs $D_1$–$D_N$ for a particular configuration of the LFSR. The waveform 72 illustrates the effective voltage profile on the VCO 36 for two complete cycles.

It will therefore be appreciated that the present invention provides for an improved method and circuit for dithering a clock signal. The present invention provides a method and circuit for dithering a clock signal generated by a PLL which avoids continually driving the PLL out of lock. At the same time, the present invention does not require significant additional hardware.

Although the invention has been shown and described with respect to certain preferred embodiments, it is obvious that equivalents and modifications will occur to others skilled in the art upon the reading and understanding of the specification. For example, the examples of FIGS. 4 and 6 could be modified such that the values of the respective outputs $D_1$ thru $D_n$ are weighted differently so as to have a different effect on the resultant modulation waveform.

Furthermore, different type reference and/or feedback dividers may be utilized in order to generate the dither signal Sdith. For example, the reference divider 24 or the feedback divider 26 as shown in FIG. 2, whichever (or both) is utilized to provide the sequence of addresses to the look-up table 38, could be made of a counter other than a binary counter or an LFSR. Another embodiment of the present invention uses a reference divider 24 and/or feedback divider 26 made up of an accumulator structure. The contents of the accumulator provide the address to the look-up table 38. By selectively controlling the amount by which the accumulator is incremented on each clock cycle (i.e., by Fvco and Fosc), it is possible to alter the frequency of the resultant dither signal Sdith obtained from the look-up table 38.

It will be appreciated that the address for the look-up table 38 may be taken from all of the bits of the accumulator or a subset thereof. Upon overflow of the accumulator, simple binary wraparound may be permitted to occur or the accumulator may be reset. If wraparound is permitted, non-integer divisors may occur which can generate disturbances in the PLL which in some circumstances may be acceptable. By resetting the accumulator upon overflow, such disturbances can be avoided.

The present invention includes all such equivalents and modifications, and is limited only by the scope of the following claims.

What is claimed is:

1. A clock generator phase-locked loop, comprising:
a reference frequency source for providing a reference frequency;
a phase comparator for producing a control signal based on a periodic comparison of a phase difference between respective signals provided to a first input and a second input of the phase comparator, the reference frequency being operatively coupled to the first input;
a voltage-controlled oscillator for generating an output frequency based on the control signal provided by the phase comparator;
a feedback divider which receives and divides the output frequency to provide a divider output which is operatively coupled to the second input of the phase comparator; and
a modulation circuit for injecting a dither signal into the control signal provided by the phase comparator to modulate the output frequency, a period of the dither signal being equal to or an integer fraction of a phase comparison period of the phase comparator.

2. The clock generator phase-locked loop of claim 1, wherein the period of the dither signal is equal to the phase comparison period.

3. The clock generator phase-locked loop of claim 1, wherein the feedback divider comprises a counter and the modulation circuit comprises a look-up table having modulation values stored therein for producing the dither signal, the value of the counter serving to provide a sequence of addresses to the look-up table for accessing the modulation values.

4. The clock generator phase-locked loop of claim 1, wherein the feedback divider comprises a counter and an output of the counter is used by the modulation circuit to produce the dither signal.

5. The clock generator phase-locked loop of claim 4, wherein the counter is a linear feedback shift register counter having a plurality of stages, and an output of at least one of the plurality of stages is used to produce the dither signal.

6. The clock generator phase-locked loop of claim 5, wherein the output of the at least one of the plurality of stages exhibits a pseudo-random sequence.

7. The clock generator phase-locked loop of claim 1, further comprising a reference divider for dividing an input reference frequency to produce the reference frequency.

8. The clock generator phase-locked loop of claim 7, wherein at least one of the reference divider and the feedback divider comprises a counter and the modulation circuit comprises a look-up table having modulation values stored therein for producing the dither signal, the value of the counter serving to provide a sequence of addresses to the look-up table for accessing the modulation values.

9. The clock generator phase-locked loop of claim 7, wherein at least one of the reference divider and the feedback divider comprises a counter and an output of the counter is used by the modulation circuit to produce the dither signal.

10. The clock generator phase-locked loop of claim 9, wherein the counter is a linear feedback shift register counter having a plurality of stages, and an output of at least one of the plurality of stages is used to produce the dither signal.

11. The clock generator phase-locked loop of claim 10, wherein the output of the at least one of the plurality of stages exhibits a pseudo-random sequence.

12. A clock generator phase-locked loop, comprising:
a reference frequency source for proving a reference frequency;
a phase comparator for producing a control signal based on a phase difference between respective signals provided to a first input and a second input of the phase comparator, the reference frequency being operatively coupled to the first input;
a voltage-controlled oscillator for generating an output frequency based on the control signal provided by the phase comparator;
a feedback divider which receives and divides the output frequency to provide a divider output which is operatively coupled to the second input of the phase comparator; and
a modulation circuit for injecting a dither signal within the clock generator phase-locked loop to modulate the output frequency,
wherein at least one of a reference divider included in the reference frequency source and the feedback divider comprises a linear feedback shift register counter having a plurality of stages, and the modulation circuit receives an output of at least one of the plurality of stages which is used to produce the dither signal.

13. The clock generator phase-locked loop of claim 12, wherein the modulation circuit comprises at least one of a digital-to-analog converter which converts the output to an analog signal which serves to modulate the control signal, and means for capacitively coupling the output to a modulator included within the modulation circuit to modulate the control signal.

14. The clock generator phase-locked loop of claim 12, wherein the output exhibits a pseudo-random sequence.

15. A method for dithering a clock generator phase-locked loop including a reference frequency source for providing a reference frequency, a phase comparator for producing a control signal based on a periodic comparison of a phase difference between respective signals provided to a first input and a second input of the phase comparator, the reference frequency being operatively coupled to the first input, a voltage-controlled oscillator for generating an output frequency based on the control signal provided by the phase comparator, and a feedback divider which receives and divides the output frequency to provide a divider output which is operatively coupled to the second input of the phase comparator, the method comprising the step of:

injecting a dither signal into the control signal provided by the phase comparator to modulate the output frequency, a period of the dither signal being equal to or an integer fraction of a phase comparison period of the phase comparator.

16. The method of claim 15, wherein the period of the dither signal is equal to the phase comparison period of the phase comparator.

17. The method of claim 15, wherein the feedback divider comprises a counter and the injecting step comprises using a look-up table having modulation values stored therein for producing the dither signal, the value of the counter serving to provide a sequence of addresses to the look-up table for accessing the modulation values.

18. The method of claim 15, wherein the feedback divider comprises a counter and an output of the counter is used to produce the dither signal.

19. The method of claim 18, wherein the counter is a linear feedback shift register counter having a plurality of stages, and an output made up of at least one of the plurality of stages is used to produce the dither signal.

20. The method of claim 19, wherein the output of the at least one of the plurality of stages exhibits a pseudo-random sequence.

21. The method of claim 15, wherein the clock generator phase-locked loop further comprises a reference divider for dividing an input reference frequency to produce the reference frequency.

22. The method of claim 21, wherein at least one of the reference divider and the feedback divider comprises a counter and the injecting step comprises using a look-up table having modulation values stored therein for producing the dither signal, the value of the counter serving to provide a sequence of addresses to the look-up table for accessing the modulation values.

23. The method of claim 21, wherein at least one of the reference divider and the feedback divider comprises a counter and an output of the counter is used to produce the dither signal.

24. The method of claim 23, wherein the counter is a linear feedback shift register counter having a plurality of stages, and an output made up of at least one of the plurality of stages is used to produce the dither signal.

25. The method of claim 24, wherein the output of the at lease one of the plurality of stages exhibits a pseudo-random sequence.

26. A method for dithering a clock generator phase-locked loop including a reference frequency source for proving a reference frequency, a phase comparator for producing a control signal based on a phase difference between respective signals provided to a first input and a second input of the phase comparator, the reference frequency being operatively coupled to the first input, a voltage-controlled oscillator for generating an output frequency based on the control signal provided by the phase comparator, and a feedback divider which receives and divides the output frequency to provide a divider output which is operatively coupled to the second input of the phase comparator, wherein at least one of a reference divider included in the reference frequency source and the feedback divider comprises a linear feedback shift register counter having a plurality of stages, the method comprising the step of:

injecting a dither signal within the clock generator phase-locked loop to modulate the output frequency, the dither signal being based on an output of at least one of the plurality of stages.

27. The method of claim 26, wherein the injecting step comprises using an digital-to-analog converter which converts the output to an analog signal which serves to modulate the control signal.

28. The method of claim 26, wherein the injecting step comprises capacitively coupling the output to a modulator used to modulate the control signal.

29. The method of claim 26, wherein the output exhibits a pseudo-random sequence.

* * * * *